(12) United States Patent
Hasegawa et al.

(10) Patent No.: US 7,639,014 B2
(45) Date of Patent: Dec. 29, 2009

(54) NUCLEAR MAGNETIC RESONANCE SPECTROMETER

(75) Inventors: Haruhiro Hasegawa, Kokubunji (JP); Hiroyuki Yamamoto, Kokubunji (JP); Kazuo Saitoh, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 281 days.

(21) Appl. No.: 11/980,579

(22) Filed: Oct. 31, 2007

(65) Prior Publication Data

US 2008/0252294 A1 Oct. 16, 2008

(30) Foreign Application Priority Data

Dec. 8, 2006 (JP) .............................. 2006-331799

(51) Int. Cl.
*G01V 3/00* (2006.01)

(52) U.S. Cl. ....................................... 324/321; 324/318

(58) Field of Classification Search ................. 324/321, 324/318, 322
See application file for complete search history.

(56) References Cited

U.S. PATENT DOCUMENTS

| | | | |
|---|---|---|---|
| 4,517,516 A * | 5/1985 | Hill et al. ..................... | 324/318 |
| 6,728,570 B2 * | 4/2004 | Kim ............................ | 600/422 |
| 7,138,801 B2 * | 11/2006 | Yamamoto et al. .......... | 324/318 |
| 7,248,049 B2 * | 7/2007 | Volke et al. ................. | 324/321 |
| 7,336,077 B2 * | 2/2008 | Wakuda et al. .............. | 324/321 |

FOREIGN PATENT DOCUMENTS

| | | |
|---|---|---|
| JP | 2005-003435 | 6/2003 |
| JP | 2005-249463 | 3/2004 |
| JP | 2006-047097 | 8/2004 |
| JP | 2006-053020 | 8/2004 |
| JP | 2006-162258 | 12/2004 |
| JP | 2006-162450 | 12/2004 |
| JP | 2006-038861 | 7/2005 |

* cited by examiner

*Primary Examiner*—Louis M Arana
(74) *Attorney, Agent, or Firm*—Stites & Harbison, PLLC; Juan Carlos A. Marquez, Esq.

(57) ABSTRACT

It is an object of the invention to provide, in a nuclear magnetic resonance spectrometer wherein the direction of the static magnetic field is the horizontal direction, a nuclear magnetic resonance probe coil having a highly uniform magnetic field, which can measure at high sensitivity. The present invention, by selecting the design and shapes of the materials forming the probe coil with a view to suppressing disorder in the magnetic field distribution, and using superconducting thin film coils formed on hollow circular substrates to form a receiver coil and coil support materials having curved surfaces, provides a nuclear magnetic resonance spectrometer of high sensitivity that can improve uniformity of a magnetic field.

19 Claims, 7 Drawing Sheets

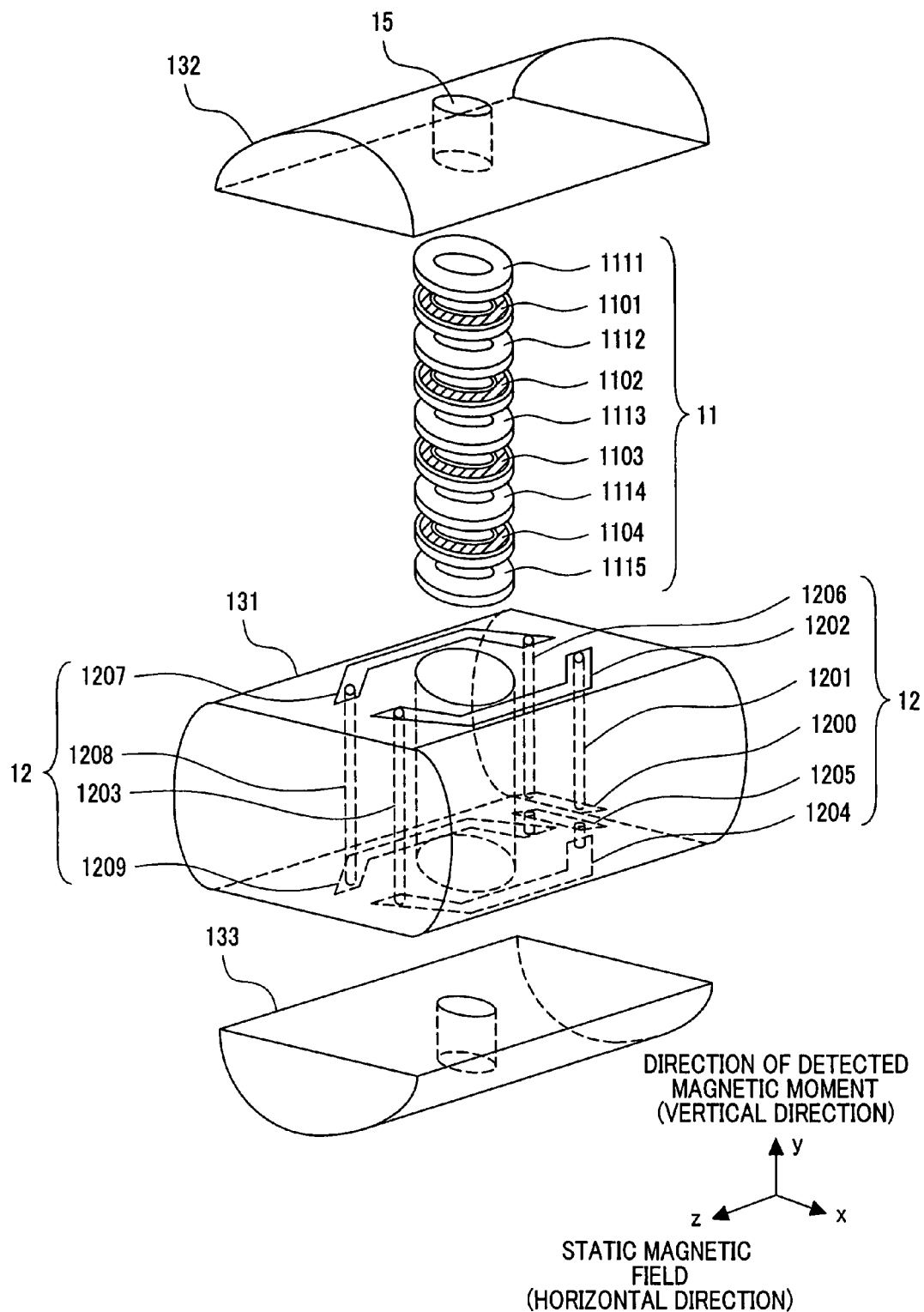

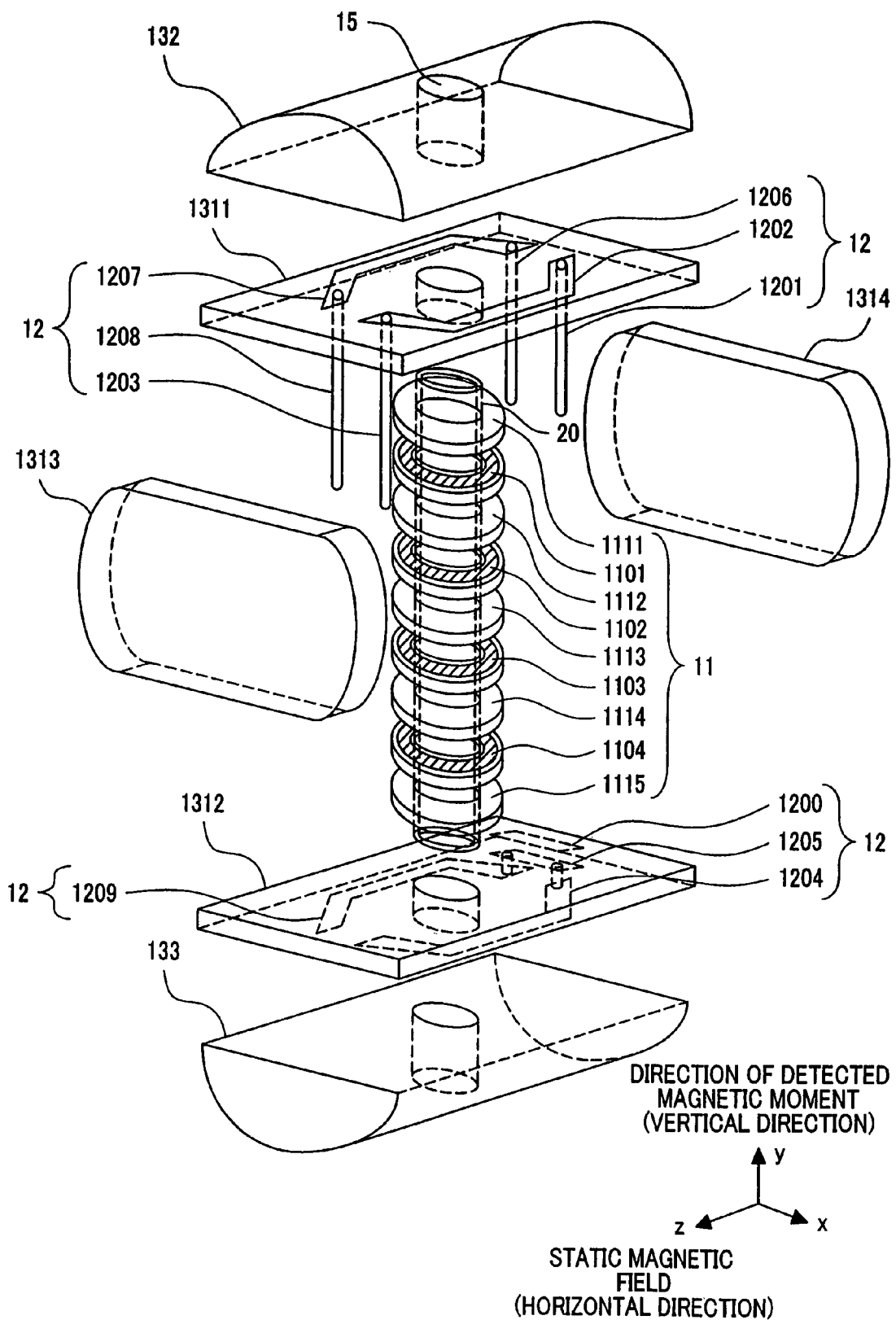

NUCLEAR MAGNETIC RESONANCE SPECTROMETER

CLAIM OF PRIORITY

The present the invention claims priority from Japanese application 2006-331799, filed on Dec. 8, 2006, the content of which is hereby incorporated by reference into this application.

BACKGROUND OF THE INVENTION

1. Field of the Invention

The present invention relates to a nuclear magnetic resonance (NMR) spectrometer, and in particular, to a nuclear magnetic resonance spectrometer having at least a split-type superconducting magnet which applies a static magnetic field in the horizontal direction, and a probe with a probe coil including a superconducting thin film coil at its tip extending in the horizontal direction.

2. Description of the Related Arts

In the conventional art, JP-A 2006-38861 (Patent Document 1) which is a first conventional art discusses the construction of a probe coil in a nuclear magnetic resonance spectrometer having a superconducting magnet that applies a static magnetic field in the vertical direction, and a probe coil that detects a magnetic moment in the horizontal direction. JP-A 2005-003435 (Patent Document 2) which is a second conventional art discusses the construction of a probe coil in a nuclear magnetic resonance spectrometer having a split-type superconducting magnet that applies a static magnetic field in the horizontal direction and a probe coil that detects a magnetic moment in the vertical direction where the probe extends in the vertical direction, and JP-A 2006-053020 (Patent Document 3) which is a third conventional art, and JP-A 2006-162258 (Patent Document 4) which is a fourth conventional art discuss the case of a probe extending in the horizontal direction.

SUMMARY OF THE INVENTION

To realize a high resolution, high sensitivity nuclear magnetic resonance spectrometer, it is required to increase the magnitude of magnetic field applied to a sample, enhance the uniformity of the sample space, and increase the sensitivity of the probe coil. To generate a uniform strong magnetic field, the coil diameter of the wire rod that generates the magnetic field is preferably made small, and the space occupied by the probe coil must also be small. The probe coil forms a resonance circuit, and an effective device of obtaining a probe coil of high sensitivity is to increase the Q factor (Quality Factor) of the probe coil. An effective device of realizing a high Q factor is to decrease the resistance in the probe coil forming the resonance circuit.

Previous attempts to fabricate a probe coil using a superconducting thin film are discussed in the conventional art examples. The dc resistance of a superconductor is zero, and its rf resistance is also small, which makes it useful as a probe coil component.

A probe coil having a superconducting thin film is useful to realize a high Q factor, but on the other hand a superconductor has the characteristic of perfect diamagnetism and a high susceptibility of $-1/4\pi$. Therefore, when designing the probe coil, it is required to maintain uniformity of the static magnetic field so that the static magnetic field is not disordered.

In the first conventional art, to achieve a high Q factor and to achieve a uniform magnetic field, N individual resonators are disposed symmetrically about a vertical axis which is the direction of the static magnetic field to form the probe coil. The sample is moved in the vertical direction and installed in a predetermined position. In general, the direction of the static magnetic field and the direction of the component of the magnetic moment detected by the probe coil must be arranged to cross each other at right angles, and since the first conventional art applies the static magnetic field in the vertical direction, this probe coil detects a magnetic moment in the horizontal direction. The probe extends in a vertical direction, so it is easy to dispose N individual resonators symmetrically about the vertical axis. However, in the first conventional art, the probe coil that detects a horizontal magnetic moment uses a probe extending in the vertical direction, and the idea of constructing a probe coil that detects a magnetic moment in the vertical direction using a probe extending in the horizontal direction, had not been considered. Again, the idea of forming the probe coil from two coils, i.e., a receiver coil and a transmitter coil, had not been considered.

In the second conventional art, relating to a nuclear magnetic resonance spectrometer wherein the sample is moved in a vertical direction to a predetermined position and the direction of the static magnetic field is the horizontal direction, the probe coil detects a magnetic moment in the vertical direction, and the probe extends in the vertical direction. In the second conventional art, a solenoidal coil whereof the center axis is in the vertical direction, is formed by laminating plural circular superconducting thin film coils on hollow circular substrates, and connecting the superconducting thin film coils by a conductive metal. In the second conventional art, the coil surfaces of the superconducting thin film coils cross the static magnetic field at right angles, and although it is attempted to make the magnetic field uniform, no consideration is given to suppressing disorder of the magnetic field due to the shape or arrangement of the materials supporting the hollow circular substrates. A solenoidal coil is formed by laminating superconducting thin film coils on the hollow circular substrates, and this is used as a receiver coil, but no consideration is given to disposing other coils in addition to the solenoidal coil while achieving a high uniformity of the magnetic field.

In the third and fourth conventional arts, relating to a nuclear magnetic resonance spectrometer wherein the sample is moved in a vertical direction to a predetermined position, and the direction of the static magnetic field is the horizontal direction, the probe coil has a receiver coil that detects a magnetic moment in the vertical direction and a transmitter coil that generates a magnetic field in a direction crossing the direction of the static magnetic field at right angles, the probe extending in the horizontal direction. In the third and fourth conventional arts, the normal to the coil surfaces of the superconducting thin film coils which are the component elements of the receiver coil, crosses the static magnetic field at right angles. Although it is attempted to make the magnetic field uniform, no consideration is given to suppressing disorder of the magnetic field due to the substrates forming the superconducting thin film coils, or to the shape and arrangement of the materials supporting the hollow circular substrates.

It is therefore an object of the present invention, in a nuclear magnetic resonance spectrometer wherein the sample is moved in the vertical direction to a predetermined position, and the direction of the static magnetic field is the horizontal direction, the spectrometer having a probe coil including a receiver coil that detects a magnetic moment in the vertical direction and a transmitter coil that generates a magnetic field in a direction crossing the static magnetic field at right angles, and the probe extending in the horizontal direction, to provide a receiver coil, a transmitter coil, and coil support materials to support the coils suitable for improving the uniformity of the magnetic field.

In order to attain this object, the nuclear magnetic resonance spectrometer of the invention has at least a split-type superconducting magnet that applies a static magnetic field in the horizontal direction, a device that transports a sample in the vertical direction to a predetermined position between two coils forming the split-type superconducting magnet, and a probe installed so as to extend in the horizontal direction on the center axis of the coils forming the split-type superconducting magnet, the spectrometer having a probe coil including a receiver coil, a transmitter coil, and support materials that support these coils at the probe tip. The receiver coil is a solenoidal coil whereof the center axis is in the vertical direction, formed by laminating plural circular superconducting thin film coils on hollow circular substrates, and connecting the superconducting thin film coils by a conductive metal, the transmitter coil is a solenoidal coil having at least two coils connected in parallel, the normal to the coil surfaces is the horizontal direction, and the receiver coil is disposed between these two coils. The coil support materials have two parallel flat surfaces and two curved surfaces connecting the two flat surfaces, a hole being formed in their center, and the receiver coil being accommodated in this hole. The receiver coil is fixed by two fixing plates, and the transmitter coil is fixed through a hole made in the coil support materials. The normal to the contact surfaces between the fixing plates and the coil support materials and the surfaces of the hollow circular substrates forming the superconducting thin film coils, is at right angles to the magnetic force lines of the static magnetic field.

According to the invention, by appropriately selecting the construction, shape and arrangement of the materials forming the probe coil to suppress disorder in the magnetic field distribution, the uniformity of the magnetic field can be improved, and a highly sensitive nuclear magnetic resonance spectrometer can be obtained.

BRIEF DESCRIPTION OF THE DRAWINGS

FIG. 2 is a schematic view of a probe coil according to the first embodiment of the invention;

FIG. 7 is a schematic view of a probe coil according to a second embodiment of the invention.

DETAILED DESCRIPTION OF THE PREFERRED EMBODIMENTS

Figure 1:
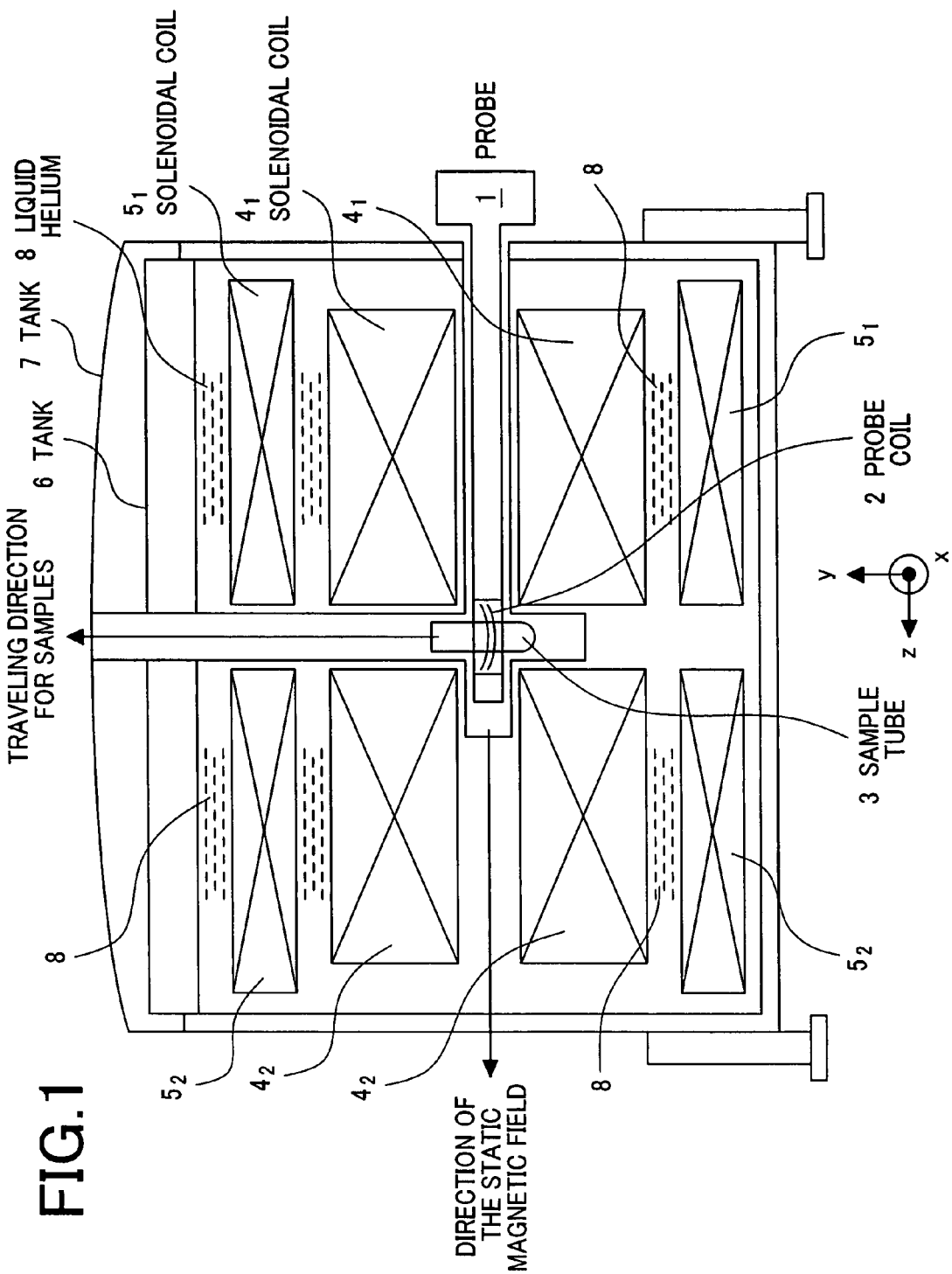
FIG. 1 is a schematic view of the overall construction of a nuclear magnetic resonance spectrometer according to a first embodiment of the invention.

Hereafter, some embodiments of the invention will be described referring to the drawings.

First Embodiment

In a first embodiment, a nuclear magnetic resonance spectrometer of high sensitivity is realized by applying a static magnetic field in the horizontal direction and using a probe extending in the horizontal direction. A probe coil is fitted to the tip of the probe. The probe coil has a receiver coil formed of a superconducting thin film, and a transmitter coil formed from copper. This embodiment relates to the construction of the probe coil.

FIG. 1 is a diagram showing a cross-section of the overall construction of a nuclear magnetic resonance spectrometer to which the probe coil of the first embodiment is fitted. $4_1$, $4_2$ are solenoidal coils for the purpose of applying a static magnetic field in the horizontal direction, these coils being disposed in a transverse direction. $5_1$, $5_2$ are solenoidal coils split into two on the outer circumferences of the solenoidal coils $4_1$, $4_2$, which are provided for the purpose of adjusting the magnetic field. These coils are mounted in double-reinforced tanks 6, 7. The inner tank 6 is filled with liquid helium 8, and the outer tank 7 is filled with liquid nitrogen. The bores of the solenoidal coils $4_1$, $4_2$ are empty, and the probe 1 is mounted by using this space. The probe 1 extends horizontally, a probe coil 2 being formed at the tip of the probe 1. A sample tube 3 containing a test sample is placed in the probe coil 2, and a static magnetic field is applied horizontally at the test sample position. The sample tube 3 is inserted and withdrawn in the vertical direction using the split position of the split solenoidal coils $4_1$, $4_2$. Therefore, the probe coil 2 detects the vertical component among the magnetic moments outputted from the sample. The directions of the X, Y, Z axes in the lower part of FIG. 1 are shown in the same way in the following diagrams.

The receiver coil which is the main component of the probe coil 2 forms a resonator, tuning and matching being performed by a trimmer capacitor (not shown) disposed inside the probe. According to the invention, the receiver coil is a solenoidal coil. To increase detection sensitivity, it is necessary to increase the Q factor of the resonator, so the solenoidal coil includes superconducting thin film coils. The sample is placed in the solenoidal coil.

By using a solenoidal coil, compared to the case where a saddle-shaped coil is used, the sample occupancy rate of the space in which the coil can capture a magnetic moment can be increased. Therefore, the magnetic moment generated from the sample can be captured efficiently, and a high sensitivity probe coil can be obtained. The sample is inserted and withdrawn in the vertical direction, so the superconducting thin film coil is disposed so that the normal to the coil surface is in the vertical direction. The superconductor has a high susceptibility of $-\frac{1}{4}\pi$, so to suppress disorder in the magnetic field due to the superconductor, the cross-linked volume of the static magnetic field and superconductor must be made small. The normal to the coil surface is the vertical direction, so if the static magnetic field is applied in the horizontal direction and the normal to the coil surface is arranged so as to cross the direction of the static magnetic field approximately at right angles, the cross-linked part of the superconductor and static magnetic field is only a small part which is the thickness of the superconducting thin film. Hence, disorder of the static magnetic field due to the superconductor can be suppressed small. Therefore, the static magnetic field must be applied in the horizontal direction, but to insert and withdraw the sample in the vertical direction and apply the static magnetic field in the horizontal direction, the superconducting magnet is split into two. To obtain a probe coil of high sensitivity, it is required to further achieve a high Q factor (Quality Factor) which ensures uniformity of the magnetic field and makes the occupancy of the probe coil small.

To generate a uniform strong magnetic field, it is preferred to make the coil diameters of the solenoidal coils $4_1$, $4_2$ small, and the occupancy of the probe coil 2 disposed inside the coils must also be made small. In this embodiment, a superconducting magnet split into two is used. Therefore, compared to the first conventional art that uses a superconducting magnet which is not split that generates a vertical magnetic field, to generate a uniform magnetic field space, the sample space is preferably made smaller. Further, to obtain a high Q factor, it is effective to form the probe coil 2 of a material having a low resistance, or form it from a superconductor.

Figure 3A:
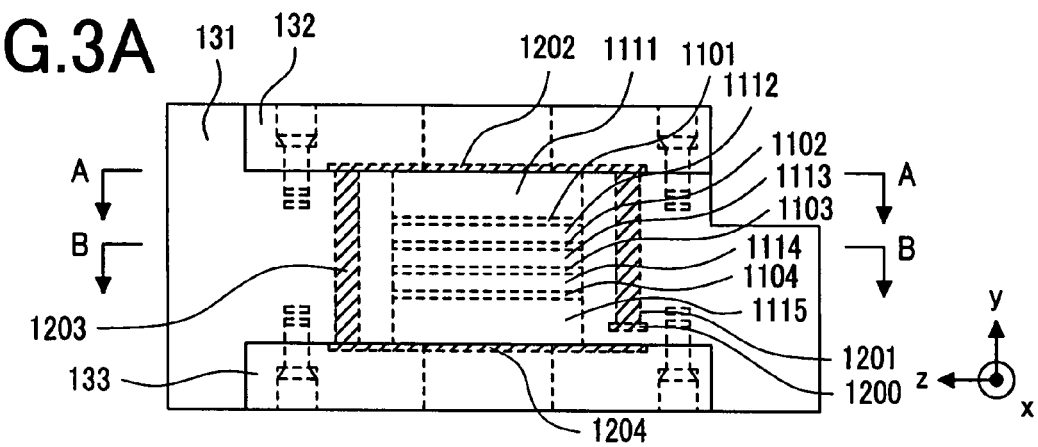
FIGS. 3A-3D are schematic views of the probe coil according to the first embodiment of the invention.
Figure 3B:
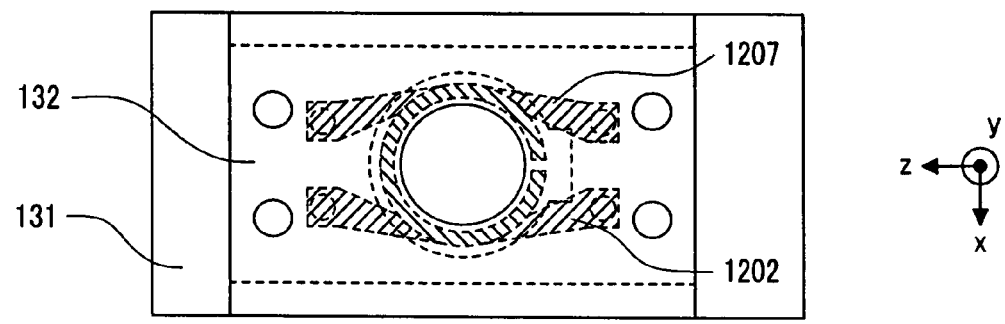
Figure 3C:
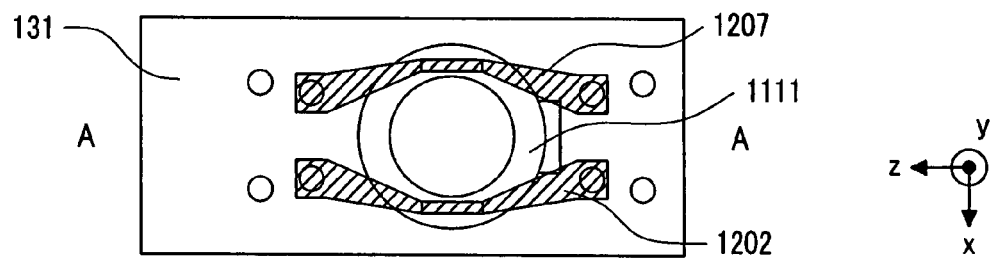
Figure 3D:
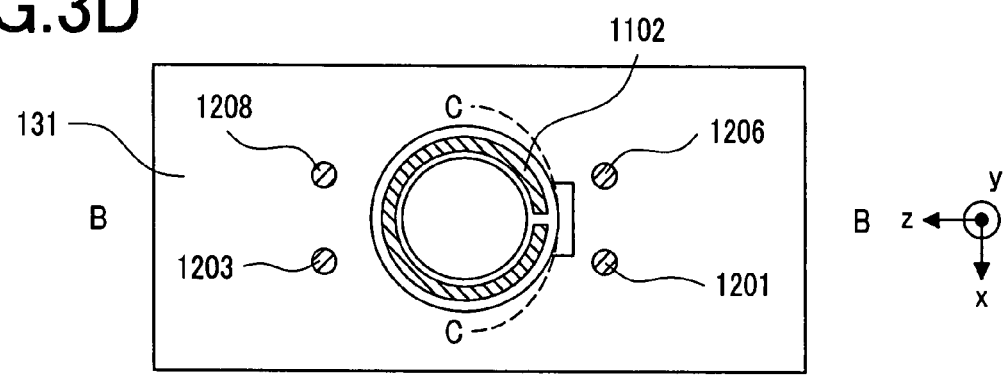

FIG. 2 is a schematic view of the probe coil according to the first embodiment. FIG. 3A shows a side surface, FIG. 3B shows an upper plan view, FIG. 3C shows a cross-section through a line A-A in FIG. 3A, and FIG. 3D shows a cross-section through a line B-B in FIG. 3A. As shown in FIG. 2, the probe coil has a receiver coil 11 that detects an output signal from the sample, a transmitter coil 12 that transmits a high frequency signal to the sample, and coil support materials. The coil support materials include a main part 131, upper fixing plate 132 and lower fixing plate 133.

Figure 5:
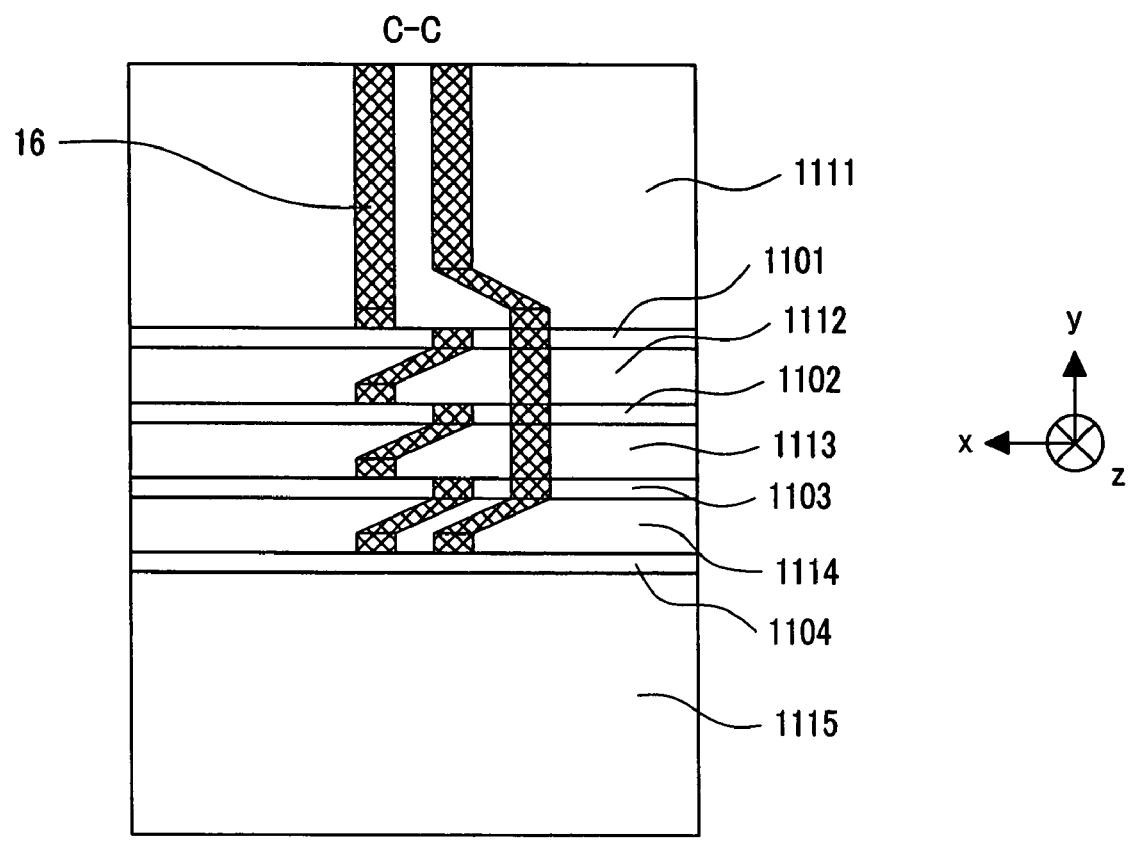
FIG. 5 is a schematic view of a line connecting a superconducting thin film coil constituting a receiver coil according to the first embodiment of the invention.

The receiver coil 11, since it is required to have a high sensitivity, is formed from oxide superconducting thin film $YBa_2Cu_3O_7$ which provides a high sensitivity. The receiver coil 11 is formed by alternately laminating $YBa_2Cu_3O_7$ thin film coils 1101, 1102, 1103, 1104 formed on hollow circular sapphire substrates and hollow circular sapphire spacers 1111, 1112, 1113, 1114, 1115. The $YBa_2Cu_3O_7$ thin film coils 1101, 1102, 1103, 1104 are connected using a copper foil lead line 16, as shown in FIG. 5.

In FIG. 2, the transmitter coil 12 is a saddle-shaped coil formed from copper (Cu) which is a normal metal, and it has a first coil including coil elements 1200, 1201, 1202, 1203, 1204, 1205, and a second coil including coil elements 1200, 1206, 1207, 1208, 1209, 1205 which are connected in parallel. For both of the first coil formed from the coil elements 1200, 1201, 1202, 1203, 1204, 1205 and the second coil formed from the coil elements 1200, 1206, 1207, 1208, 1209, 1205, the normal to the coil surface is the horizontal direction, and they are disposed to cross the vertical direction and the static magnetic field direction at right angles. The receiver coil 11 is disposed between these first and second coils. The sample tube is inserted into and withdrawn from the probe coil through a sample space 15. The static magnetic field is applied in the horizontal direction, and the receiver coil detects the vertical component among the magnetic moments output from the sample.

In this embodiment, to obtain high sensitivity, the receiver coil is a solenoidal coil instead of a saddle-shaped coil. Since a solenoidal coil having a center axis in the vertical direction is used as the receiver coil, the static magnetic field must be applied in the horizontal direction. For this reason, a split-type superconducting magnet formed from two split coils is used. The receiver solenoidal coil is formed by laminating plural circular superconducting thin film coils, and connecting these superconducting thin film coils by a conductive metal. To prevent the magnetic field distribution from becoming disordered, firstly, the design is such that the magnetic field does not cross the surface of the superconducting thin film. Secondly in this embodiment, to further prevent the magnetic field distribution from becoming disordered, the shape of the substrates forming the superconducting thin film coils is not square but circular, and the substrates are hollow circular plates having a hole in the center to allow placement of the sample therein. Square-shaped parts cause disorder of the magnetic field. In this embodiment, disorder of the magnetic field distribution is suppressed by making the shape of the substrate a hollow circular plate. Hollow circular spacers are also inserted between the substrates on which the superconducting thin film coils are formed. Thirdly, the shape and arrangement of the hollow circular substrates and hollow circular spacers are determined so that they are symmetrical with respect to the horizontal axis which is the direction of the static magnetic field.

In this example, the oxide superconducting thin film $YBa_2Cu_3O_7$ is used as a superconductor, and the substrate used to form the superconducting thin film must be a non-magnetic material to ensure uniformity of the magnetic field. Further, to ensure cooling of the superconducting thin film, a material having a high thermal conductivity must be used. In this embodiment, a sapphire substrate is used since it satisfies both of these conditions, and the spacers are also of sapphire.

The receiver coil 11 is formed by laminating hollow circular sapphire substrates having a superconducting thin film coil formed on the top surface. The normal to the substrate is the vertical direction. A hole is formed in the center of the sapphire substrate, the sample tube 3 being inserted through this hole. The receiver coil 11 forms a resonator, and the signal generated from the resonator is taken to the outside along the main part of the probe 1 by a semi-rigid cable 13 which is a signal transmission device.

Figure 6A:
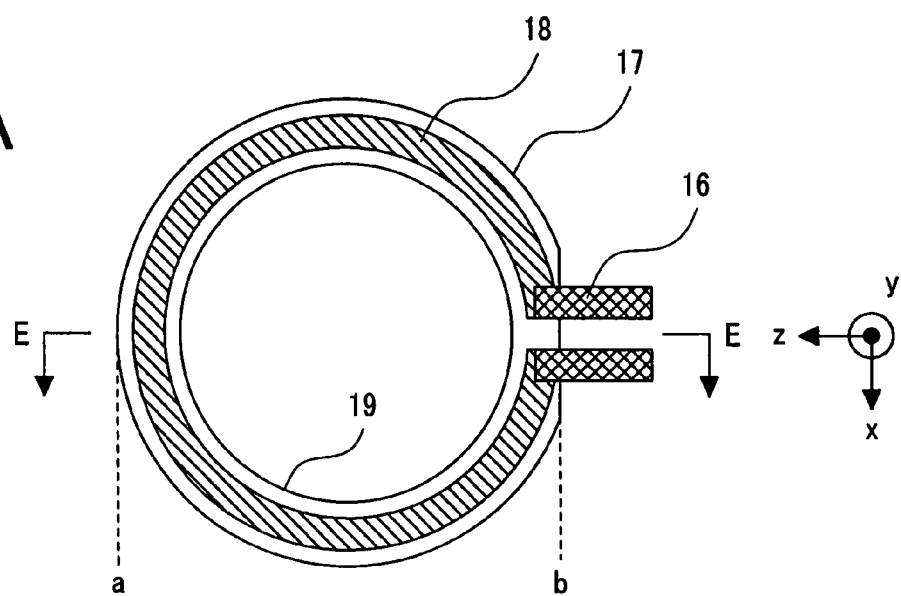
FIGS. 6A-6B are schematic views of a superconducting thin film coil forming the receiver coil according to the first embodiment of invention.
Figure 6B:
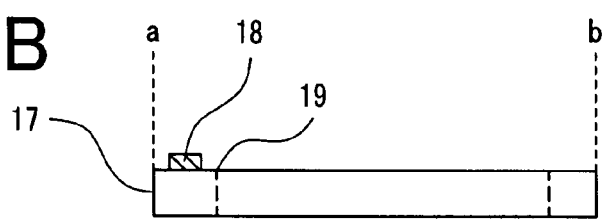

FIGS. 6A-6B are diagrams describing the construction of the superconducting thin film coil which forms the receiver coil of the first embodiment. FIG. 6A is a plan view. 17 is a sapphire ($Al_2O_3$) substrate, and a superconducting thin film 18 of the oxide superconductor $YBa_2Cu_3O_7$ is formed on the surface in the shape of a ring. 19 is a hole, and is the part through which the sample tube 3 is inserted. FIG. 6B is a cross-sectional view from the direction of the arrow at a position E-E in FIG. 6A. The superconducting thin film 18 is formed on the surface of the sapphire substrate 17, the hole 19 being formed in the center.

The coil includes the superconducting thin film 18 shown in FIGS. 6A and 6B is fabricated as follows.

First, $CeO_2$ of film thickness 100 nm is formed as a buffer layer on the sapphire ($Al_2O_3$) substrate 17, and the superconducting thin film 18 of the oxide superconductor $YBa_2Cu_3O_7$ is then formed. The film thickness of the $YBa_2Cu_3O_7$ thin film is a larger value than the magnetic penetration depth of 100 nm. However, since the surface roughness of the $YBa_2Cu_3O_7$ thin film increases if the film thickness is more than 1 μm, the film thickness of the $YBa_2Cu_3O_7$ thin film may appropriately be from 100 nm to 1 μm. In the first embodiment, it is 150 nm. The $YBa_2Cu_3O_7$ thin film is patterned by the usual fabrication process of resist coating, photolithography and Ar etching.

A hole is then machined in the sapphire plate 17 and the hole 19 is machined for the sample tube to manufacture the superconducting thin film coil shown in FIGS. 6A-6B.

In FIGS. 2 and 3, the transmitter coil 12 is a copper saddle-shaped coil having two coils connected in parallel, the normal to these two coil surfaces is the horizontal direction, and the receiver coil is disposed between these two coils.

An input signal passes through the main part of the probe 1 from outside, and is transmitted to the saddle-shaped coil by a semi-rigid cable which is a signal transmission device. A large pulse current is applied to the transmitter coil 12 from a transmitting circuit via the semi-rigid cable, and a magnetic moment having a component crossing the static magnetic field at right angles is generated by the sample inserted in the space formed by the receiving coil. The magnetic moment having a component crossing the static magnetic field at right angles gradually relaxes, and the signal output from the sample at this time is received.

To increase the uniformity of the magnetic field, in this embodiment, the coil surfaces of the superconducting thin film coils are disposed so as not to cross the magnetic field, the substrates forming the superconducting thin films are hollow circular plates, and the shape and arrangement of the hollow circular plates are symmetrical with respect to the horizontal axis which is the direction of the static magnetic field. Also in FIGS. 2 and 3, to suppress disorder in the magnetic field distribution arising from the coil support materials and enhance the uniformity of the magnetic field, their shape and arrangement are determined with regard to the following points.

The coil support materials, as shown in FIG. 2 and FIG. 3A-3D, firstly include the main part 131 and two fixing plates 132, 133 arranged on the top and bottom of the main part, these members being fabricated from sapphire. The number of component elements forming the coil support materials is reduced as much as possible, and by forming them of an identical material without using plural different materials, disorder in the magnetic field distribution which would be produced by connecting parts of component elements and differences of susceptibility if different materials were used, is suppressed. The coil support materials form an insulator, but they have a high thermal conductivity to obtain good cooling characteristics and are fabricated from sapphire which is a non-magnetic material.

Figure 4A:
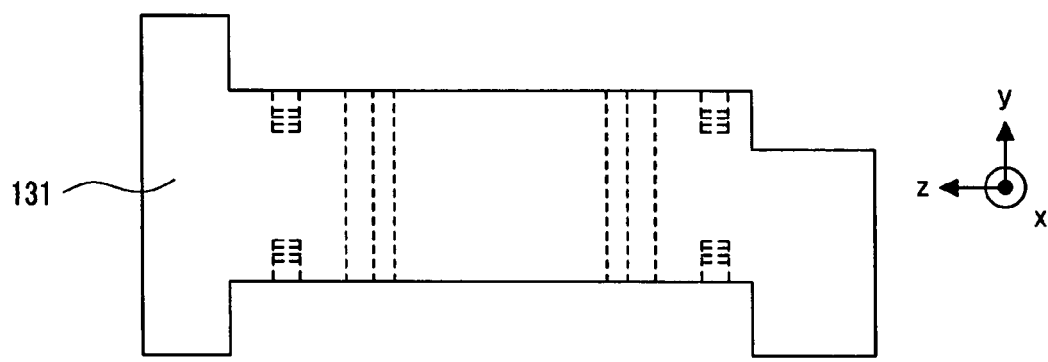
FIGS. 4A-4C are schematic views of the coil support materials according to the first embodiment of the invention.
Figure 4B:
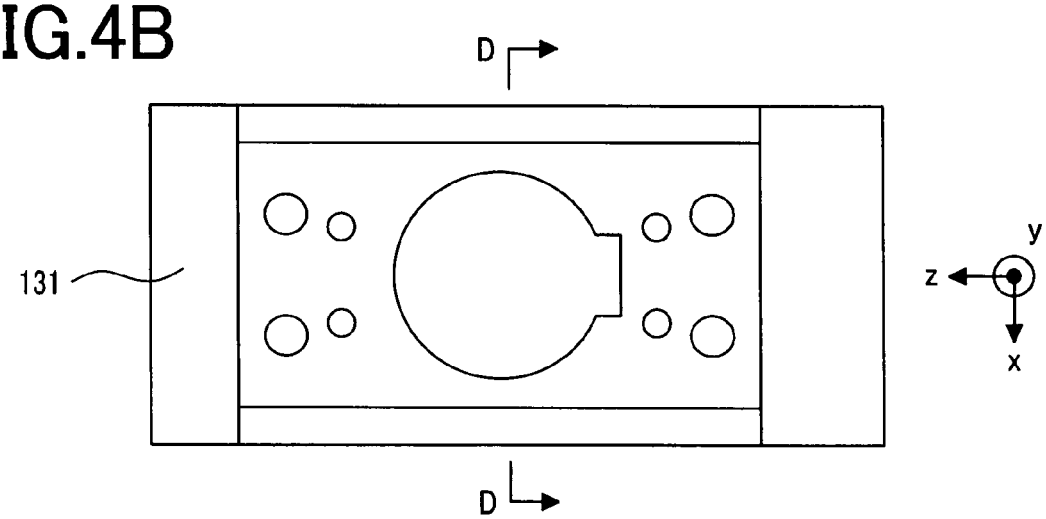
Figure 4C:
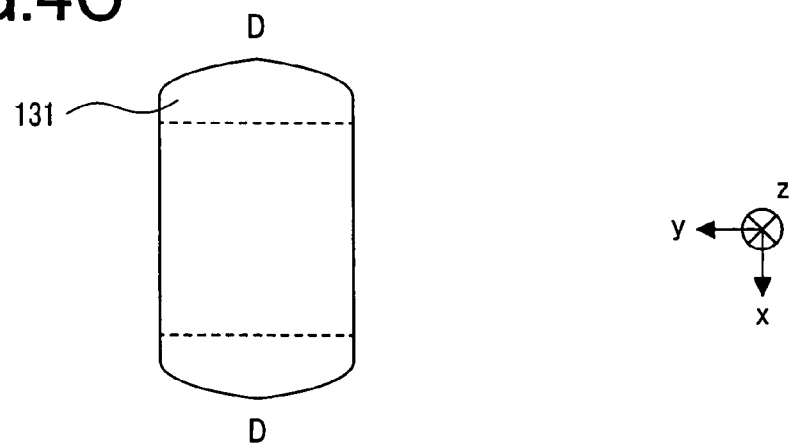

Secondly, the main part 131 of the coil support materials, whereof a side view is shown in FIG. 4A, an upper plan view is shown in FIG. 4B, and a cross-section along D-D in FIG. 4B is shown in FIG. 4C, has two parallel, flat surfaces and two curved surfaces joining these two flat surfaces, a hole for inserting the receiver coil being formed in the middle. Since square-shaped parts of the main part 131 of the coil support materials cause disorder in the magnetic field, the uniformity of the magnetic field is improved by making the shape circular or elliptical.

Thirdly, in the connecting parts of the main part 131 and fixing plates 132, 133, the normals to the connecting surfaces are the vertical direction, and the connecting surfaces are arranged so as not to cross the magnetic field. Due to this, disorder in the magnetic field due to discontinuous surfaces of connecting parts although they are formed of an identical material, is suppressed.

Fourthly, the shape and arrangement are determined to maintain symmetry with respect to the horizontal axis which is the direction of the static magnetic field, and the fixing plates are provided on the top and bottom of the main part.

By determining the shape and arrangement of the coil support materials as described above, disorder in the magnetic field distribution is suppressed, and uniformity of the magnetic field is improved.

In this embodiment, the magnetic resonance spectrometer is designed so that the static magnetic field is applied in the horizontal direction, using a probe extending in the horizontal direction, and the solenoidal receiver coil is constructed by laminating superconducting thin film coils wherein the normal to the coil surfaces is the vertical direction. The substrates forming the superconducting thin films are hollow circular plates, the shape and arrangement of the hollow circular plates are determined to be symmetrical with respect to the horizontal axis which is the direction of the static magnetic field, the receiver coil and transmitter coil are fixed using coil support materials at the probe tip, and the construction, shape and arrangement of the coil support materials are determined to suppress disorder in the magnetic field distribution. Due to this, the uniformity of the magnetic field can be improved, and a nuclear magnetic resonance spectrometer of high sensitivity can be manufactured.

Second Embodiment

A second embodiment is an example where a receiver coil and coil support materials of different shape from those of the first embodiment are used. FIG. 7 shows a schematic view of the probe coil according to the second embodiment. As shown in FIG. 7, the probe coil comprises the receiver coil 11 that detects the output signal from the sample, the transmitter coil 12 that transmits a high frequency signal to the sample, and coil support materials.

The receiver coil 11 is formed by alternately laminating $YBa_2Cu_3O_7$ thin film coils 1101, 1102, 1103, 1104 with hollow circular sapphire spacers 1111, 1112, 1113, 1114, 1115 on hollow circular sapphire substrates, and passing them through a sapphire cylindrical pipe 20. The $YBa_2Cu_3O_7$ thin film coils 1101, 1102, 1103, 1104 are connected using a copper foil lead line (not shown) as in the first embodiment. The upper part and lower part of the sapphire cylindrical pipe 20 are fixed to the receiver coil 11 via sapphire plates 1311, 1312.

The coil support materials are sapphire plates 1311, 1312, 1313, 1314, the upper fixing plate 132 and the lower fixing plate 133. The plates 1311, 1312 fix the receiver coil 11 and transmitter coil 12, and the plates 1313, 1314 support the plates 1311, 1312 from the side. The whole structure is fixed by sandwiching these between the upper fixing plate 132 and lower fixing plate 133 to form the probe coil.

In this embodiment, the receiver is formed using circular substrates, spacers and the cylindrical sapphire pipe 20, so symmetry in the region near the sample is good, and disorder in the uniformity of the magnetic field can be suppressed. Further, the receiver coil is supported by fixing the upper part and lower part of the sapphire cylindrical pipe 20 using the sapphire plates 1311, 1312, so there are no parts in the region near the sample except the substrates, spacers and cylindrical sapphire pipe 20. Hence, the number of component parts can be reduced, plural different materials is not used, and disorder in the magnetic field due to difference of susceptibility due to connections between component parts and the use of different materials, can be suppressed.

By determining the shape and arrangement of the coil support materials in this way, disorder in the magnetic field distribution is suppressed, and uniformity of the magnetic field is improved.

What is claimed is:

1. A nuclear magnetic resonance spectrometer, comprising:

a split-type superconducting magnet including a first coil formed on a first frame and a second coil formed on a second frame installed in opposition to the first frame, the magnet applying a static magnetic field in a first direction;

a device for moving a sample in a direction crossing the first direction at right angles, and transporting the sample to a predetermined position between the first and second coils;

a probe installed so that it extends in the first direction in a region including the center axes of the first and second coils; and a receiver coil, a transmitter coil and a probe coil having coil support materials that support the coils installed at the probe tip, wherein the coil support materials include a main part surrounded by members having two flat surfaces which are parallel and opposite to each other and two curved surfaces connected respectively to the two flat surfaces, a first fixing plate connected to one of the flat surfaces by an attachment member, and a second fixing plate connected to the other flat surface by an attachment member, the receiver coil is arranged inside a hole which passes through the first and second fixing plates, and the members having the first and second flat surfaces, respectively, the transmitter coil is formed in the main part surrounding the receiver coil, and the normal to the contact surface between the fixing plates and the main part is arranged to cross magnetic force lines of the static magnetic field at right angles.

2. The nuclear magnetic resonance spectrometer according to claim 1, wherein the receiving coil is a solenoidal coil.

3. The nuclear magnetic resonance spectrometer according to claim 1, wherein the receiving coil is a solenoidal coil whereof the center axis is arranged to cross the first direction at right angles.

4. The nuclear magnetic resonance spectrometer according to claim 1, wherein the receiving coil is a solenoidal coil formed by laminating a plurality of circular superconducting thin film coils provided on hollow circular substrates, and connecting the superconducting thin film coils by a conductive metal.

5. The nuclear magnetic resonance spectrometer according to claim 1, wherein the first and second fixing plates have a semi-cylindrical shape.

6. The nuclear magnetic resonance spectrometer according to claim 4, wherein the superconducting thin film coil is formed on the substrate via a buffer layer having a predetermined thickness.

7. The nuclear magnetic resonance spectrometer according to claim 4, wherein the thickness of the superconducting thin film coil is 100 nm to 1 μm.

8. The nuclear magnetic resonance spectrometer according to claim 4, wherein the material of the substrate is sapphire.

9. The nuclear magnetic resonance spectrometer according to claim 1, wherein the transmitter coil is a saddle-shaped coil having at least two coils connected in parallel.

10. The nuclear magnetic resonance spectrometer according to claim 1, wherein the transmitter coil is a saddle-shaped coil having at least two coils connected in parallel, and the normal to the two coil surfaces is a direction crossing the first direction at right angles.

11. The nuclear magnetic resonance spectrometer according to claim 1, wherein the connecting parts of the attachment members are in the main part outside the region where the transmitter coil is installed.

12. A nuclear magnetic resonance spectrometer, comprising:

a split-type superconducting magnet including a first coil formed on a first frame and a second coil formed on a second frame installed in opposition to the first frame, the magnet applying a static magnetic field in a first direction;

a device for moving a sample in a direction crossing the first direction at right angles, and transporting the sample to a predetermined position between the first and second coils;

a probe installed so that it extends in the first direction in a region including the center axes of the coils; and a receiver coil, a transmitter coil and a probe coil having coil support materials that support the coils installed at the probe tip, wherein the coil support materials include a main part surrounded by members having two flat surfaces which are parallel and opposite to each other and two curved surfaces connected respectively to the two flat surfaces, a first fixing plate connected to one of the flat surfaces by an attachment member, and a second fixing plate connected to the other of the flat surfaces by an attachment member, the receiver coil is a solenoidal coil wherein a plurality of circular superconducting thin film coils are laminated on hollow circular substrates, the superconducting thin film coils are connected by a conductive metal, a cylindrical pipe is fixed by internal connection to the laminated hollow circular plates, the coil is arranged inside a hole which passes through the first and second fixing plates and the members having the first and second flat surfaces, respectively, and the normal to the contact surface between the fixing plates and the main part is arranged to cross magnetic force lines of the static magnetic field at right angles.

13. The nuclear magnetic resonance spectrometer according to claim 12, wherein the receiver coil is a solenoidal coil whereof the center axis is arranged to cross the first direction at right angles.

14. The nuclear magnetic resonance spectrometer according to claim 12, wherein the superconducting thin film coil is formed on the substrate via a buffer layer having a predetermined thickness.

15. The nuclear magnetic resonance spectrometer according to claim 12, wherein the thickness of the superconducting thin film coil is 100 nm to 1 μm.

16. The nuclear magnetic resonance spectrometer according to claim 12, wherein the material of the substrate is sapphire.

17. The nuclear magnetic resonance spectrometer according to claim 12, wherein the transmitter coil is a saddle-shaped coil having at least two coils connected in parallel.

18. The nuclear magnetic resonance spectrometer according to claim 12, wherein the transmitter coil is a saddle-shaped coil having at least two coils connected in parallel, and the normal to the two coil surfaces is a direction crossing the first direction at right angles.

19. The nuclear magnetic resonance spectrometer according to claim 12, wherein connecting parts of the attachment members are in the main part outside the region where the transmitter coil is provided.

* * * * *